United States Patent
Khlat

(10) Patent No.: US 11,038,464 B2
(45) Date of Patent: Jun. 15, 2021

(54) ENVELOPE TRACKING AMPLIFIER APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 24 days.

(21) Appl. No.: 16/689,417

(22) Filed: Nov. 20, 2019

(65) Prior Publication Data

US 2020/0382061 A1    Dec. 3, 2020

Related U.S. Application Data

(60) Provisional application No. 62/854,535, filed on May 30, 2019.

(51) Int. Cl.
| | |
|---|---|
| *H03F 1/30* | (2006.01) |
| *H03F 1/02* | (2006.01) |
| *H03F 3/213* | (2006.01) |
| *H04B 1/16* | (2006.01) |

(52) U.S. Cl.
CPC ............ *H03F 1/02* (2013.01); *H03F 3/213* (2013.01); *H04B 1/16* (2013.01); *H03F 2200/102* (2013.01); *H03F 2200/451* (2013.01)

(58) Field of Classification Search
CPC ...................................................... H03F 1/30
USPC ........................................ 330/297, 296, 285
See application file for complete search history.

(56) References Cited

U.S. PATENT DOCUMENTS

| | | | |
|---|---|---|---|
| 6,529,716 | B1 | 3/2003 | Eidson et al. |
| 6,788,151 | B2 | 9/2004 | Shvarts et al. |
| 8,019,289 | B2 | 9/2011 | Gorbachov |
| 8,290,453 | B2 | 10/2012 | Yoshihara |
| 8,385,859 | B2 | 2/2013 | Hamano |
| 8,476,976 | B2 | 7/2013 | Wimpenny |
| 8,598,950 | B2 | 12/2013 | Khesbak |
| 8,600,321 | B2 | 12/2013 | Nambu et al. |

(Continued)

OTHER PUBLICATIONS

Non-Final Office Action for U.S. Appl. No. 16/263,368, dated Dec. 26, 2019, 6 pages.

(Continued)

*Primary Examiner* — Henry Choe
(74) *Attorney, Agent, or Firm* — Withrow & Terranova, P.L.L.C.

(57) ABSTRACT

An envelope tracking (ET) amplifier apparatus is provided. The ET amplifier apparatus includes an ET integrated circuit (IC) (ETIC) and a distributed ETIC (DETIC) coupled to the ETIC. The DETIC may be configured to provide a distributed voltage to a distributed amplifier circuit for amplifying a distributed radio frequency (RF) signal. In examples discussed herein, the ETIC is configured to generate a low-frequency current, which can affect the distributed voltage, at a desired level based on a feedback signal received from the DETIC. The DETIC may be configured to generate the feedback signal based on an indication(s) related to the distributed voltage. By dynamically adjusting the low-frequency current, and thus the distributed voltage, based on the feedback signal, it may be possible to maintain operating efficiency of the distributed amplifier circuit across a wider range of modulation bandwidth with minimal cost and/or size impact on the ET amplifier apparatus.

20 Claims, 5 Drawing Sheets

(56) References Cited

U.S. PATENT DOCUMENTS

| | | |
|---|---|---|
| 8,611,402 B2 | 12/2013 | Chiron |
| 8,665,016 B2 | 3/2014 | Chowdhury et al. |
| 8,665,931 B2 | 3/2014 | Afsahi et al. |
| 8,803,603 B2 | 8/2014 | Wimpenny |
| 8,816,272 B1 | 8/2014 | Brown et al. |
| 8,816,768 B2 | 8/2014 | Tseng et al. |
| 8,818,305 B1 | 8/2014 | Schwent et al. |
| 8,921,774 B1 | 12/2014 | Brown et al. |
| 8,942,651 B2 | 1/2015 | Jones |
| 8,989,682 B2 | 3/2015 | Ripley et al. |
| 9,002,303 B2 | 4/2015 | Brobston |
| 9,065,509 B1 | 6/2015 | Yan et al. |
| 9,197,162 B2 | 11/2015 | Chiron et al. |
| 9,197,256 B2 | 11/2015 | Khlat |
| 9,246,460 B2 | 1/2016 | Khlat et al. |
| 9,247,496 B2 | 1/2016 | Khlat |
| 9,270,230 B2 | 2/2016 | Henshaw et al. |
| 9,287,829 B2 | 3/2016 | Nobbe et al. |
| 9,288,098 B2 | 3/2016 | Yan et al. |
| 9,294,043 B2 | 3/2016 | Ripley et al. |
| 9,374,005 B2 | 6/2016 | Rozek et al. |
| 9,379,667 B2 | 6/2016 | Khlat et al. |
| 9,438,172 B2 | 9/2016 | Cohen |
| 9,515,621 B2 | 12/2016 | Hietala et al. |
| 9,515,622 B2 | 12/2016 | Nentwig et al. |
| 9,516,693 B2 | 12/2016 | Khlat et al. |
| 9,571,152 B2 | 2/2017 | Ripley et al. |
| 9,596,110 B2 | 3/2017 | Jiang et al. |
| 9,614,476 B2 | 4/2017 | Khlat |
| 9,614,477 B1 | 4/2017 | Rozenblit et al. |
| 9,641,206 B2 | 5/2017 | Pratt et al. |
| 9,671,801 B2 | 6/2017 | Bhattad et al. |
| 9,743,357 B2 | 8/2017 | Tabe |
| 9,831,834 B2 * | 11/2017 | Balteanu .............. H03F 3/68 |
| 9,831,934 B2 | 11/2017 | Kotecha et al. |
| 9,843,294 B2 | 12/2017 | Khlat |
| 9,859,845 B2 | 1/2018 | Sarbishaei et al. |
| 9,912,296 B1 | 3/2018 | Cheng et al. |
| 9,912,297 B2 | 3/2018 | Khlat |
| 9,912,301 B2 | 3/2018 | Xue et al. |
| 9,941,844 B2 | 4/2018 | Khlat |
| 9,948,240 B2 | 4/2018 | Khlat et al. |
| 9,954,436 B2 | 4/2018 | Khlat |
| 9,960,737 B1 | 5/2018 | Kovac |
| 9,974,050 B2 | 5/2018 | Wiser et al. |
| 9,991,851 B1 | 6/2018 | Dinur et al. |
| 9,991,856 B2 | 6/2018 | Khesbak et al. |
| 9,991,913 B1 | 6/2018 | Dinur et al. |
| 10,003,303 B2 | 6/2018 | Afsahi et al. |
| 10,069,470 B2 | 9/2018 | Khlat et al. |
| 10,090,809 B1 | 10/2018 | Khlat |
| 10,097,387 B1 | 10/2018 | Wiser et al. |
| 10,103,926 B1 | 10/2018 | Khlat |
| 10,110,169 B2 | 10/2018 | Khesbak et al. |
| 10,141,891 B2 | 11/2018 | Gomez et al. |
| 10,158,330 B1 | 12/2018 | Khlat |
| 10,171,037 B2 | 1/2019 | Khlat |
| 10,171,038 B1 | 1/2019 | Chen et al. |
| 10,181,826 B2 | 1/2019 | Khlat et al. |
| 10,204,775 B2 | 2/2019 | Brown et al. |
| 10,305,429 B2 | 5/2019 | Choo et al. |
| 10,326,408 B2 | 6/2019 | Khlat et al. |
| 10,355,646 B2 | 7/2019 | Lee et al. |
| 10,361,660 B2 | 7/2019 | Khlat |
| 10,382,147 B2 | 8/2019 | Ripley et al. |
| 10,396,716 B2 | 8/2019 | Afsahi et al. |
| 10,419,255 B2 | 9/2019 | Wiser et al. |
| 10,432,145 B2 | 10/2019 | Khlat |
| 10,439,557 B2 | 10/2019 | Khlat et al. |
| 10,439,789 B2 | 10/2019 | Brunel et al. |
| 10,454,428 B2 | 10/2019 | Khesbak et al. |
| 10,476,437 B2 | 11/2019 | Nag et al. |
| 2004/0100323 A1 | 5/2004 | Khanifer et al. |
| 2009/0128236 A1 | 5/2009 | Wilson |
| 2009/0253389 A1 | 10/2009 | Ma et al. |
| 2011/0223875 A1 | 9/2011 | Hamano |
| 2012/0142304 A1 | 6/2012 | Degani et al. |
| 2012/0146731 A1 | 6/2012 | Khesbak |
| 2012/0194274 A1 | 8/2012 | Fowers et al. |
| 2012/0302179 A1 | 11/2012 | Brobston |
| 2012/0309333 A1 | 12/2012 | Nambu et al. |
| 2013/0141159 A1 | 6/2013 | Strange et al. |
| 2013/0207731 A1 | 8/2013 | Balteanu |
| 2013/0285750 A1 | 10/2013 | Chowdhury et al. |
| 2014/0111279 A1 | 4/2014 | Brobston |
| 2014/0218109 A1 | 8/2014 | Wimpenny |
| 2014/0306763 A1 | 10/2014 | Hong et al. |
| 2014/0306769 A1 | 10/2014 | Khlat et al. |
| 2014/0361837 A1 | 12/2014 | Strange et al. |
| 2015/0009980 A1 | 1/2015 | Modi et al. |
| 2015/0091645 A1 | 4/2015 | Park et al. |
| 2015/0123628 A1 | 5/2015 | Bhattad et al. |
| 2015/0194988 A1 | 7/2015 | Yan et al. |
| 2015/0236729 A1 | 8/2015 | Peng et al. |
| 2016/0036389 A1 | 2/2016 | Balteanu et al. |
| 2016/0050629 A1 | 2/2016 | Khesbak et al. |
| 2016/0094185 A1 * | 3/2016 | Shute .............. H03F 1/0222 330/297 |
| 2016/0094186 A1 | 3/2016 | Cohen |
| 2016/0105151 A1 | 4/2016 | Langer |
| 2016/0181995 A1 | 6/2016 | Nentwig et al. |
| 2016/0204809 A1 | 7/2016 | Pratt et al. |
| 2016/0226448 A1 | 8/2016 | Wimpenny |
| 2016/0294587 A1 | 10/2016 | Jiang et al. |
| 2017/0070199 A1 | 3/2017 | Anderson et al. |
| 2017/0077877 A1 | 3/2017 | Anderson |
| 2017/0093340 A1 | 3/2017 | Khesbak |
| 2017/0207802 A1 | 7/2017 | Pratt et al. |
| 2017/0230924 A1 | 8/2017 | Wolberg et al. |
| 2017/0279412 A1 | 9/2017 | Afsahi et al. |
| 2017/0353287 A1 | 12/2017 | Onaka et al. |
| 2018/0048276 A1 | 2/2018 | Khlat et al. |
| 2018/0138862 A1 | 5/2018 | Balteanu et al. |
| 2018/0138863 A1 | 5/2018 | Khlat |
| 2018/0159476 A1 | 6/2018 | Balteanu et al. |
| 2018/0159566 A1 | 6/2018 | Dinur et al. |
| 2018/0287564 A1 | 10/2018 | Afsahi et al. |
| 2018/0309409 A1 | 10/2018 | Khlat |
| 2018/0309414 A1 | 10/2018 | Khlat et al. |
| 2018/0316440 A1 | 11/2018 | Mita |
| 2018/0358930 A1 | 12/2018 | Haine |
| 2019/0036493 A1 | 1/2019 | Khlat et al. |
| 2019/0044480 A1 | 2/2019 | Khlat |
| 2019/0089310 A1 | 3/2019 | Khlat et al. |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222176 A1 | 7/2019 | Khlat |
| 2019/0222181 A1 | 7/2019 | Khlat |
| 2019/0267947 A1 | 8/2019 | Khlat et al. |
| 2019/0356285 A1 | 11/2019 | Khlat et al. |
| 2020/0036337 A1 | 1/2020 | Khlat |
| 2020/0076375 A1 | 3/2020 | Khlat |
| 2020/0076376 A1 | 3/2020 | Khlat |
| 2020/0127607 A1 | 4/2020 | Khlat |
| 2020/0127608 A1 | 4/2020 | Khlat |
| 2020/0127609 A1 | 4/2020 | Khlat |
| 2020/0127611 A1 | 4/2020 | Khlat |
| 2020/0127612 A1 | 4/2020 | Khlat et al. |
| 2020/0127625 A1 | 4/2020 | Khlat |
| 2020/0127730 A1 | 4/2020 | Khlat |
| 2020/0136575 A1 | 4/2020 | Khlat et al. |
| 2020/0350878 A1 | 11/2020 | Drogi et al. |

OTHER PUBLICATIONS

Notice of Allowance for U.S. Appl. No. 16/273,288, dated Dec. 13, 2019, 8 pages.

Non-Final Office Action for U.S. Appl. No. 16/263,316, dated Dec. 23, 2019, 9 pages.

Notice of Allowance for U.S. Appl. No. 16/193,513, dated Mar. 25, 2020, 8 pages.

(56) References Cited

OTHER PUBLICATIONS

Non-Final Office Action for U.S. Appl. No. 16/250,229, dated Apr. 29, 2020, 7 pages.
Non-Final Office Action for U.S. Appl. No. 16/267,740, dated Apr. 30, 2020, 10 pages.
Final Office Action for U.S. Appl. No. 16/263,316, dated May 13, 2020, 10 pages.
Non-Final Office Action for U.S. Appl. No. 16/278,886, dated Apr. 29, 2020, 9 pages.
Quayle Action for U.S. Appl. No. 16/267,779, dated May 1, 2020, 8 pages.
Final Office Action for U.S. Appl. No. 16/263,368, dated May 22, 2020, 9 pages.
Quayle Action for U.S. Appl. No. 16/267,740, dated Oct. 19, 2020, 7 pages.
Non-Final Office Action for U.S. Appl. No. 16/263,316, dated Nov. 24, 2020, 4 pages.
Non-Final Office Action for U.S. Appl. No. 16/263,368, dated Dec. 17, 2020, 8 pages.
Notice of Allowance for U.S. Appl. No. 16/508,704, dated Dec. 30, 2020, 7 pages.
Notice of Allowance for U.S. Appl. No. 16/508,768, dated Oct. 27, 2020, 9 pages.
Quayle Action for U.S. Appl. No. 16/514,339, dated Nov. 19, 2020, 9 pages.
Notice of Allowance for U.S. Appl. No. 16/250,229, dated Sep. 22, 2020, 7 pages.
Notice of Allowance for U.S. Appl. No. 16/278,886, dated Sep. 22, 2020, 8 pages.
U.S. Appl. No. 16/689,236, filed Nov. 20, 2019.
U.S. Appl. No. 16/660,900, filed Oct. 23, 2019.
U.S. Appl. No. 16/669,728, filed Oct. 31, 2019.
Non-Final Office Action for U.S. Appl. No. 16/263,316, dated Jul. 17, 2020, 4 pages.
Notice of Allowance for U.S. Appl. No. 16/270,119, dated Jun. 18, 2020, 9 pages.
Non-Final Office Action for U.S. Appl. No. 16/250,298, dated Aug. 20, 2020, 8 pages.
Non-Final Office Action for U.S. Appl. No. 16/263,368, dated Aug. 7, 2020, 4 pages.
Notice of Allowance for U.S. Appl. No. 16/267,740, dated Mar. 3, 2021, 8 pages.
Notice of Allowance for U.S. Appl. No. 16/263,316, dated Mar. 30, 2021, 7 pages.
Duayle Action for U.S. Appl. No. 16/250,298, dated Feb. 3, 2021, 5 pages.
Notice of Allowance for U.S. Appl. No. 16/250,298, dated Apr. 15, 2021, 8 pages.
Non-Final Office Action for U.S. Appl. No. 16/689,236, dated Mar. 2, 2021, 15 pages.
Notice of Allowance for U.S. Appl. No. 16/263,368, dated Apr. 29, 2021, 7 pages.
Non-Final Office Action for U.S. Appl. No. 16/660,900, dated Feb. 18, 2021, 7 pages.

* cited by examiner

ENVELOPE TRACKING AMPLIFIER APPARATUS

RELATED APPLICATIONS

This application claims the benefit of provisional patent application Ser. No. 62/854,535, filed May 30, 2019, the disclosure of which is hereby incorporated herein by reference in its entirety.

FIELD OF THE DISCLOSURE

The technology of the disclosure relates generally to an envelope tracking (ET) power amplifier apparatus.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as fifth-generation new-radio (5G-NR) technology configured to communicate a millimeter wave (mmWave) radio frequency (RF) signal(s) in an mmWave spectrum located above 12 GHz frequency. To achieve higher data rates, mobile communication devices may employ power amplifiers to increase output power of mmWave RF signals (e.g., maintaining sufficient energy per bit). However, increased output power of mmWave RF signals can lead to increased power consumption and thermal dissipation in the mobile communication devices, thus compromising overall performance and user experience.

Envelope tracking (ET) is a power management technology designed to improve efficiency levels of power amplifiers to help reduce power consumption and thermal dissipation in mobile communication devices. In an ET system, a power amplifier(s) amplifies an RF signal(s) based on a time-variant ET voltage(s) generated in accordance to time-variant amplitudes of the RF signal(s). More specifically, the time-variant ET voltage(s) corresponds to a time-variant voltage envelope(s) that tracks (e.g., rises and falls) a time-variant power envelope(s) of the RF signal(s). Understandably, the better the time-variant voltage envelope(s) tracks the time-variant power envelope(s), the higher linearity the power amplifier(s) can achieve.

However, time-variant ET voltage(s) can be highly susceptible to distortions caused by trace inductance, particularly when the time-variant ET voltage(s) is so generated to track the time-variant power envelope(s) with a high modulation bandwidth (e.g., >50 MHz) RF signal(s). As a result, the time-variant voltage envelope(s) may become misaligned with the time-variant power envelope(s) of the RF signal(s), thus causing unwanted distortions (e.g., amplitude clipping) in the RF signal(s). In this regard, it may be necessary to ensure that the ET power amplifier(s) can consistently operate at a desired linearity for any given instantaneous power requirement of the RF signal(s).

SUMMARY

Embodiments of the disclosure relate to an envelope tracking (ET) amplifier apparatus. The ET amplifier apparatus includes an ET integrated circuit (IC) (ETIC) and a distributed ETIC (DETIC) coupled to the ETIC. In a non-limiting example, the DETIC is configured to provide a distributed voltage, which can be an ET voltage or an average power tracking (APT) voltage, to a distributed amplifier circuit for amplifying a distributed radio frequency (RF) signal. In examples discussed herein, the ETIC is configured to generate a low-frequency current, which can affect the distributed voltage, at a desired level based on a feedback signal received from the DETIC. The DETIC may be configured to generate the feedback signal based on an indication(s) related to the distributed voltage. By dynamically adjusting the low-frequency current, and thus the distributed voltage, based on the feedback signal, it may be possible to maintain operating efficiency of the distributed amplifier circuit across a wider range of modulation bandwidth with minimal cost and/or size impact on the ET amplifier apparatus.

In one aspect, an ET amplifier apparatus is provided. The ET amplifier apparatus includes an ETIC. The ETIC includes a tracker circuit configured to generate a low-frequency current. The ETIC also includes a control circuit. The control circuit is configured to receive a feedback signal configured to indicate a desired level of the low-frequency current. The control circuit is also configured to generate a control signal based on the feedback signal to cause the tracker circuit to adjust the low-frequency current to the desired level. The ET amplifier apparatus also includes a DETIC coupled to the ETIC. The DETIC includes a distributed voltage circuit configured to generate a distributed voltage comprising a distributed offset voltage corresponding to the low-frequency current. The DETIC also includes a feedback circuit. The feedback circuit is configured to receive at least one indication related to the distributed voltage. The feedback circuit is also configured to determine the desired level of the low-frequency current based on the at least one indication. The feedback circuit is also configured to generate the feedback signal to indicate the desired level of the low-frequency current. The feedback circuit is also configured to provide the feedback signal to the control circuit.

In another aspect, an ET amplifier apparatus is provided. The ET amplifier apparatus includes an ETIC. The ETIC includes a tracker circuit configured to generate a low-frequency current. The ETIC also includes a digital control circuit. The digital control circuit is configured to receive a digital control signal configured to indicate a desired level of the low-frequency current. The digital control circuit is also configured to cause the tracker circuit to adjust the low-frequency current to the desired level. The ET amplifier apparatus also includes a DETIC coupled to the ETIC. The DETIC includes a distributed voltage circuit configured to generate a distributed voltage comprising a distributed offset voltage corresponding to the low-frequency current. The DETIC also includes a feedback circuit. The feedback circuit is configured to receive at least one indication related to the distributed voltage. The feedback circuit is also configured to determine the desired level of the low-frequency current based on the at least one indication. The feedback circuit is also configured to generate a feedback signal to indicate the desired level of the low-frequency current. The DETIC also includes a control circuit. The control circuit is configured to receive the feedback signal from the feedback circuit. The control circuit is also configured to generate a control signal based on the feedback signal. The DETIC also includes a digital interface circuit. The digital interface circuit is configured to convert the control signal into the digital control signal. The digital interface circuit is also configured to provide the digital control signal to the digital control circuit.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
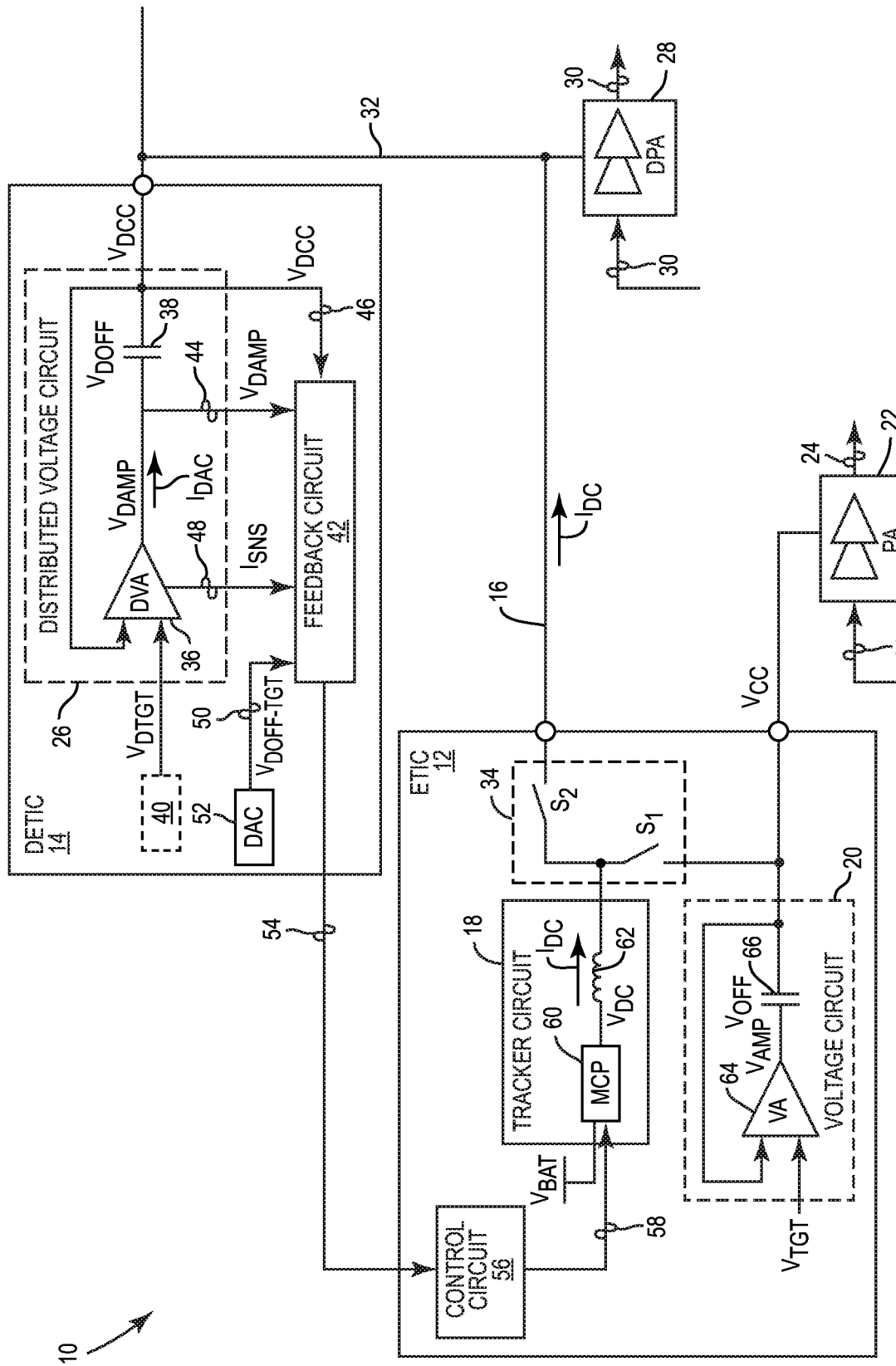
FIG. 1 is a schematic diagram of an exemplary envelope tracking (ET) amplifier apparatus configured according to an embodiment of the present disclosure to achieve a higher power amplifier efficiency across a wider range of signal modulation bandwidth.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) amplifier apparatus. The ET amplifier apparatus includes an ET integrated circuit (ETIC) and a distributed ETIC (DETIC) coupled to the ETIC. In a non-limiting example, the DETIC is configured to provide a distributed voltage, which can be an ET voltage or an average power tracking (APT) voltage, to a distributed amplifier circuit for amplifying a distributed radio frequency (RF) signal. In examples discussed herein, the ETIC is configured to generate a low-frequency current, which can affect the distributed voltage, at a desired level based on a feedback signal received from the DETIC. The DETIC may be configured to generate the feedback signal based on an indication(s) related to the distributed voltage. By dynamically adjusting the low-frequency current, and thus the distributed voltage, based on the feedback signal, it may be possible to maintain operating efficiency of the distributed amplifier circuit across a wider range of modulation bandwidth with minimal cost and/or size impact on the ET amplifier apparatus.

In this regard, FIG. 1 is a schematic diagram of an exemplary ET amplifier apparatus 10 configured according to an embodiment of the present disclosure to achieve a higher power amplifier efficiency across a wider range of signal modulation bandwidth. The ET amplifier apparatus 10 includes an ETIC 12 and a DETIC 14. The DETIC 14 may be coupled to the ETIC 12 via a conductive trace(s) 16, as an example.

The ETIC 12 includes a tracker circuit 18 configured to generate a low-frequency current $I_{DC}$ (e.g., a direct current) and a voltage circuit 20 configured to generate a modulated voltage $V_{CC}$, which can be an ET voltage or an average power tracking (APT) voltage. The ETIC 12 may be configured to provide the modulated voltage $V_{CC}$ to an amplifier circuit 22 for amplifying an RF signal 24. The amplifier circuit 22 may be configured to be part of the ET amplifier apparatus 10 or outside of the ET amplifier apparatus 10.

The DETIC 14 includes a distributed voltage circuit 26 configured to generate a distributed voltage $V_{DCC}$. Similar to the modulated voltage $V_{CC}$, the distributed voltage $V_{DCC}$ can also be generated as an ET voltage or an APT voltage. The DETIC 14 may be configured to provide the distributed voltage $V_{DCC}$ to a distributed amplifier circuit 28 for amplifying a distributed RF signal 30. The distributed amplifier circuit 28 may be configured to be part of the ET amplifier apparatus 10 or outside of the ET amplifier apparatus 10.

In a non-limiting example, the DETIC 14 is coupled to the distributed amplifier circuit 28 via a local conductive trace(s) 32 that is significantly shorter (e.g., less than one-fifth) than the conductive trace(s) 16. As such, the local conductive trace(s) 32 can correspond to a significantly lower trace inductance (e.g., <0.7 nH) than the conductive trace(s) 16. As a result, it may be possible to reduce unwanted distortion in the distributed voltage $V_{DCC}$, especially when the distributed RF signal 30 is modulated in a higher modulation bandwidth (e.g., >50 MHz).

The ETIC 12 and the DETIC 14 may have many commonalities as well as differences. One significant difference between the ETIC 12 and the DETIC 14 is that the DETIC 14 does not include the tracker circuit 18 as the ETIC 12 does. Instead, the DETIC 14 is configured to draw the low-frequency $I_{DC}$ from the tracker circuit 18 in the ETIC 12. In a non-limiting example, the ETIC 12 includes a switch circuit 34 configured to selectively provide the low-frequency $I_{DC}$ to the amplifier circuit 22 or the DETIC 14. By eliminating the tracker circuit 18 from the DETIC 14, it may be possible to build the DETIC 14 with lower cost and a smaller footprint compared to the ETIC 12. In addition, since the low-frequency current $I_{DC}$ is a direct current, the low-frequency current $I_{DC}$ can be less susceptible to distortion resulting from the trace inductance associated with the conductive trace(s) 16.

In a non-limiting example, the distributed voltage circuit 26 includes a distributed voltage amplifier 36 (denoted as "DVA") and a distributed offset capacitor 38. The distributed voltage amplifier 36 is configured to generate a distributed initial voltage $V_{DAMP}$ based on a distributed target voltage $V_{DTGT}$. The distributed target voltage $V_{DTGT}$ may be generated by a distributed target voltage circuit 40 in the DETIC 14 or received from a coupled circuit, such as the ETIC 12 or a transceiver circuit (not shown). The distributed offset capacitor 38 is configured to raise the distributed initial voltage $V_{DAMP}$ by a distributed offset voltage $V_{DOFF}$ to generate the distributed voltage $V_{DCC}$ ($V_{DCC}=V_{DAMP}+V_{DOFF}$).

As illustrated in FIG. 1, the distributed offset capacitor 38 is coupled to the ETIC 12 to be charged by the low-frequency current $I_{DC}$. As such, the distributed offset voltage $V_{DOFF}$, and accordingly the distributed voltage $V_{DCC}$, may be impacted by the low-frequency current $I_{DC}$. In this regard, for a given level of the distributed initial voltage $V_{DAMP}$, the distributed voltage $V_{DCC}$ may become higher or lower as a result of an increase or a decrease of the low-frequency current $I_{DC}$.

Notably, the distributed amplifier circuit 28 will operate at a higher efficiency if the distributed voltage $V_{DCC}$ can closely track (e.g., rises and falls) the time-variant amplitudes of the distributed RF signal 30, particularly when the distributed RF signal 30 corresponds to the wider range of signal modulation bandwidth (e.g., up to 200 MHz). In this regard, it may be desirable to dynamically adjust the distributed voltage $V_{CC}$ based on a specific modulation bandwidth of the distributed RF signal 30. As discussed in detail below, it may be possible to adjust the distributed voltage $V_{CC}$ by dynamically adjusting the distributed offset voltage $V_{DOFF}$ via the low-frequency current $I_{DC}$.

In this regard, the DETIC 14 can be configured to include a feedback circuit 42. The feedback circuit 42 can be configured to a first indication 44 indicative of the distributed initial voltage $V_{DAMP}$, a second indication 46 indicative of the distributed voltage $V_{DCC}$, and a third indication 48 indicative of a sense current $I_{SNS}$ that is proportionally related to a high-frequency current $I_{DAC}$ (e.g., an alternating current) being sourced or sunk by the distributed voltage amplifier 36. The feedback circuit 42 may also receive a fourth indication 50 indicative of a target voltage $V_{DOFF-TGT}$ for the distributed offset voltage $V_{DOFF}$, for example from a distributed digital-to-analog converter 52 (denoted as "DAC"). The first indication 44, the second indication 46, the third indication 48, and the fourth indication 50 may be collectively referred to as "at least one indication." The feedback circuit 42 may be configured to determine a desired level of the low-frequency current $I_{DC}$ based on the at least one indication and generate a feedback signal 54 to indicate the desired level of the low-frequency current $I_{DC}$. In a non-limiting example, the feedback signal 54 is an analog feedback signal.

The ETIC 12 includes a control circuit 56 configured to receive the feedback signal 54 from the feedback circuit 42. Accordingly, the control circuit 56 generates a control signal 58 configured to cause the tracker circuit 18 to adjust the low-frequency current $I_{DC}$.

The tracker circuit 18 includes a multi-level charge pump (MCP) 60 and a power inductor 62. The MCP 60 can be configured to generate a low-frequency voltage $V_{DC}$ based on a battery voltage $V_{BAT}$. The MCP 60 may generate the low-frequency voltage $V_{DC}$ at multiple voltage levels proportionally related to the battery voltage $V_{BAT}$. As an example, the MCP 60 can generate the low-frequency voltage $V_{DC}$ that equals $0 \times V_{BAT}$ (0 volts), $1 \times V_{BAT}$, or $2 \times V_{BAT}$. The power inductor 62 is configured to induce the low-frequency current $I_{DC}$ based on the low-frequency voltage $V_{DC}$. Thus, by controlling the MCP 60 to generate the low-frequency voltage $V_{DC}$ at different voltage levels, the control circuit 56 may cause the power inductor 62 to adjust the low-frequency current $I_{DC}$ accordingly.

The voltage circuit 20 in the ETIC 12 can include a voltage amplifier 64 (denoted as "VA") and an offset capacitor 66. The voltage amplifier 64 can be configured to generate an initial modulated voltage $V_{AMP}$ based on a target voltage $V_{TGT}$, which can be identical to or different from the distributed target voltage $V_{DTGT}$ in the DETIC 14. The offset capacitor 66 can be configured to raise the initial modulated voltage $V_{AMP}$ by an offset voltage $V_{OFF}$ to generate the modulated voltage $V_{CC}$ ($V_{CC}=V_{AMP}+V_{OFF}$). The switch circuit 34 may include a first switch $S_1$ and a second switch $S_2$ configured to selectively couple the tracker circuit 18 to the amplifier circuit 22 and the DETIC 14, respectively.

Figure 2:
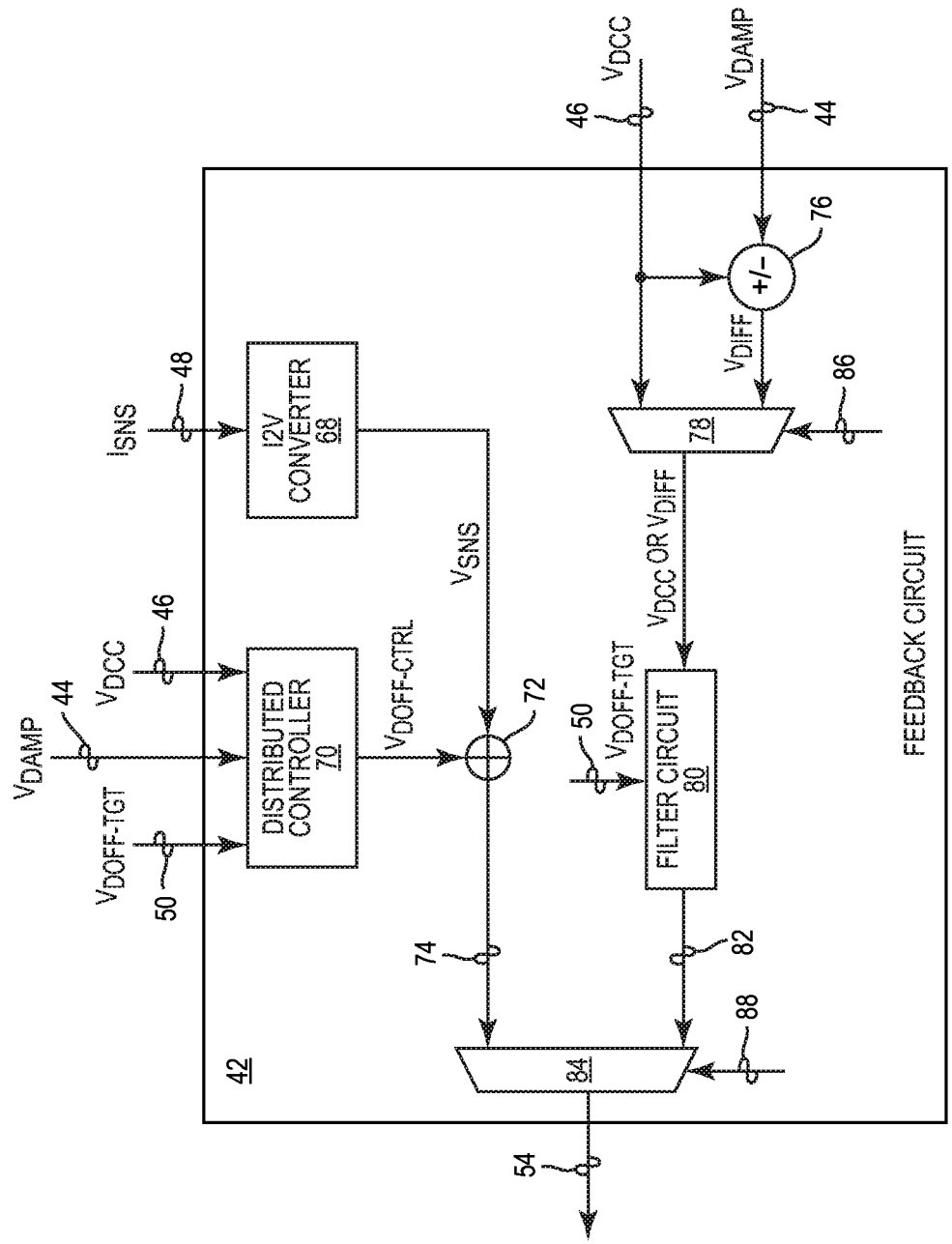
FIG. 2 is a schematic diagram providing an exemplary illustration of a feedback circuit provided in the ET amplifier apparatus of FIG. 1.

FIG. 2 is a schematic diagram providing an exemplary illustration of the feedback circuit 42 in the DETIC 14 of the ET amplifier apparatus 10 of FIG. 1. Common elements between FIGS. 1 and 2 are shown therein with common element numbers and will not be re-described herein.

In a non-limiting example, the feedback circuit 42 includes a current-to-voltage (I2V) converter 68 configured to convert the sense current $I_{SNS}$, as indicated by the third indication 48, into a sense voltage $V_{SNS}$. The feedback circuit 42 includes a distributed controller 70, which can be a microprocessor or a microcontroller, as an example. The distributed controller 70 is configured to receive the first indication 44, the second indication 46, and the fourth indication 50. Accordingly, the distributed controller 70 may generate an offset control voltage $V_{DOFF\text{-}CTRL}$ based on the distributed initial voltage $V_{DAMP}$, the distributed voltage $V_{DCC}$, and the target voltage $V_{DOFF\text{-}TGT}$ for the distributed offset voltage $V_{DOFF}$, as indicated by the first indication 44, the second indication 46, and the fourth indication 50, respectively. The feedback circuit 42 also includes a first voltage combiner 72 configured to combine the sense voltage $V_{SNS}$ and the offset control voltage $V_{DOFF\text{-}CTRL}$ to generate a first voltage feedback 74.

The feedback circuit 42 includes a second voltage combiner 76 configured to generate a differential voltage $V_{DIFF}$ between the distributed voltage $V_{DCC}$ and the distributed initial voltage $V_{DAMP}$. The feedback circuit 42 includes an input multiplexer 78 configured to selectively output one of the distributed voltage $V_{DCC}$ and the differential voltage $V_{DIFF}$. The feedback circuit 42 may include a filter circuit 80 configured to generate a second voltage feedback 82 based on the distributed voltage $V_{DCC}$ or the differential voltage $V_{DIFF}$ outputted by the input multiplexer 78. The filter circuit 80 may be configured to receive the target voltage $V_{DOFF\text{-}TGT}$ for the distributed offset voltage $V_{DOFF}$, as indicated by the fourth indication 50. Accordingly, the filter circuit 80 may generate the second voltage feedback 82 with proper poles and/or zeros, depending on which of the distributed voltage $V_{DCC}$ and the differential voltage $V_{DIFF}$ is outputted by the input multiplexer 78.

The feedback circuit 42 further includes an output multiplexer 84 configured to generate the feedback signal 54 that includes only one of the first voltage feedback 74 and the second voltage feedback 82. In a non-limiting example, the input multiplexer 78 and the output multiplexer 84 are controlled by an input control signal 86 and an output control signal 88, respectively. The input control signal 86 and the output control signal 88 may be generated either internally (e.g., by the distributed controller 70) or externally (e.g., by the ETIC 12).

The output multiplexer 84 may be configured to generate the feedback signal 54 exclusively including the first voltage feedback 74 when the distributed RF signal 30 corresponds to a lower modulation bandwidth (e.g., ≤50 MHz). Accordingly, the distributed voltage amplifier 36 can be configured to generate a distributed initial ET voltage $V_{DAMP}$ based on a distributed ET target voltage $V_{DTGT}$. The distributed offset capacitor 38 raises the distributed initial ET voltage $V_{DAMP}$ by the distributed offset voltage $V_{DOFF}$ to generate a distributed ET voltage $V_{DCC}$.

The output multiplexer 84 may be configured to generate the feedback signal 54 exclusively including the second voltage feedback 82 when the distributed RF signal 30 corresponds to a higher modulation bandwidth (e.g., >50 MHz). In one example, the distributed voltage amplifier 36 can be configured to generate the distributed initial ET voltage $V_{DAMP}$ based on the distributed ET target voltage $V_{DTGT}$. The distributed offset capacitor 38 raises the distributed initial ET voltage $V_{DAMP}$ by the distributed offset voltage $V_{DOFF}$ to generate the distributed ET voltage $V_{DCC}$. Accordingly, the input multiplexer 78 may be controlled to output the differential voltage $V_{DIFF}$ to the filter circuit 80. In another example, the distributed voltage amplifier 36 can be configured to generate a distributed initial APT voltage $V_{DAMP}$ based on a distributed APT target voltage $V_{DTGT}$. The distributed offset capacitor 38 raises the distributed initial APT voltage $V_{DAMP}$ by the distributed offset voltage $V_{DOFF}$ to generate a distributed APT voltage $V_{DCC}$. Accordingly, the input multiplexer 78 may be controlled to output the distributed APT voltage $V_{DCC}$ to the filter circuit 80.

Figure 3:
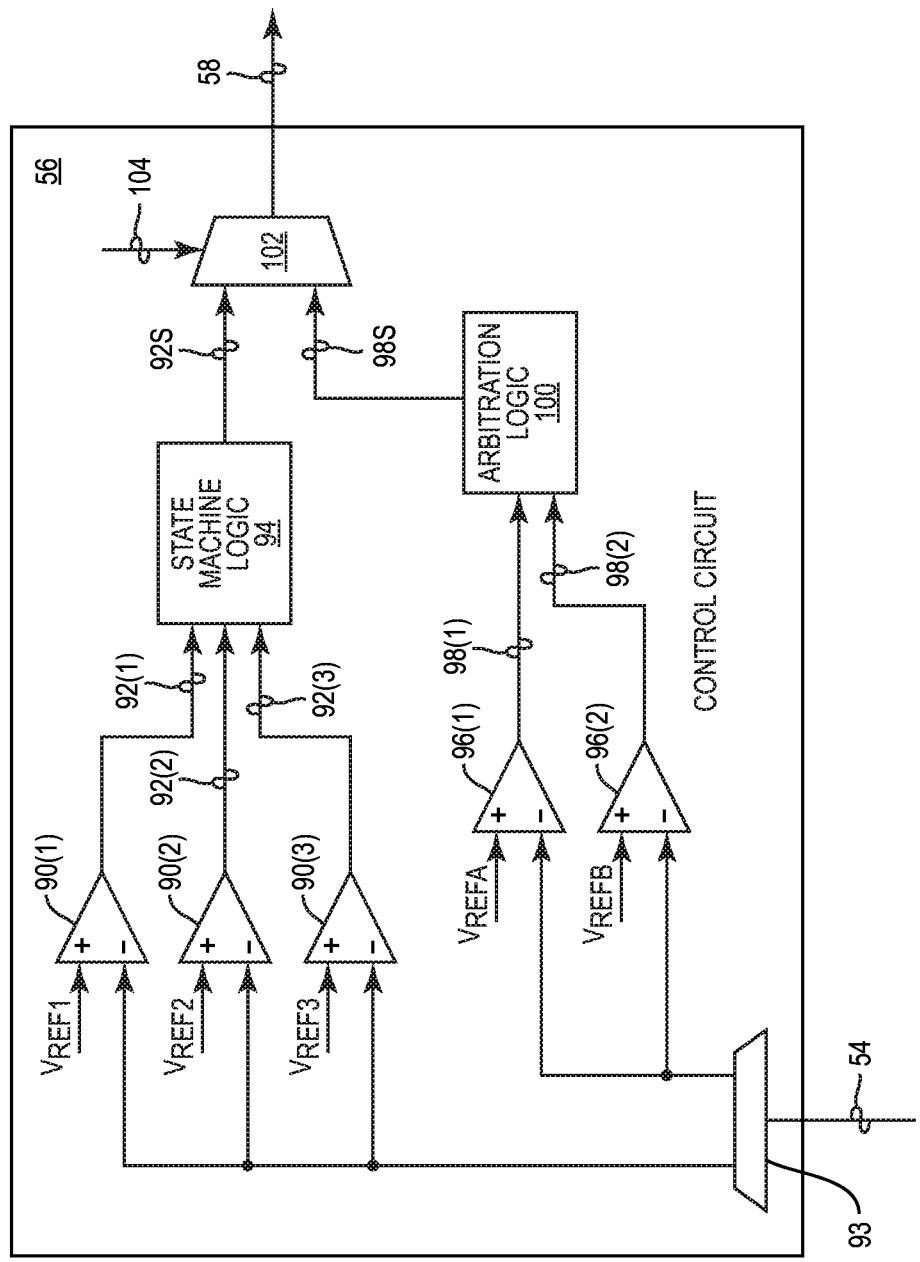
FIG. 3 is a schematic diagram providing an exemplary illustration of a control circuit provided in the ET amplifier apparatus of FIG. 1.

FIG. 3 is a schematic diagram providing an exemplary illustration of the control circuit 56 in the ETIC 12 of the ET amplifier apparatus 10 of FIG. 1. Common elements between FIGS. 1 and 3 are shown therein with common element numbers and will not be re-described herein.

The control circuit 56 includes a number of first comparators 90(1)-90(3) configured to compare the feedback signal 54 against a number of first thresholds $V_{REF1}$-$V_{REF3}$ to generate a number of first voltage adjustment signals 92(1)-92(3), respectively. It should be appreciated that the control circuit 56 can be configured to include more or less than the first comparators 90(1)-90(3) as illustrated herein based on a desired granularity of the first thresholds $V_{REF1}$-$V_{REF3}$. The control circuit 56 may include a de-multiplexer 93 configured to route the feedback signal 54 to the first comparators 90(1)-90(3). The control circuit 56 includes a state machine logic 94, which can be implemented by a field-programmable gate array (FPGA) as an example. The state machine logic 94 may be configured to selectively output a selected first voltage adjustment signal 92S among the first voltage adjustment signals 92(1)-92(3).

The control circuit 56 also includes a number of second comparators 96(1)-96(2) configured to compare the feedback signal 54 against a number of second thresholds $V_{REFA}$-$V_{REFB}$ to generate a number of second voltage adjustment signals 98(1)-98(2), respectively. It should be appreciated that the control circuit 56 can be configured to include more or less than the second comparators 96(1)-96(2) as illustrated herein based on a desired granularity of the second thresholds $V_{REFA}$-$V_{REFB}$. The de-multiplexer 93 may be further configured to route the feedback signal 54 to the second comparators 96(1)-96(2). The control circuit 56 includes an arbitration logic 100, which can be implemented by an FPGA as an example. The arbitration logic 100 may be configured to selectively output a selected second voltage adjustment signal 98S among the second voltage adjustment signals 98(1)-98(2).

The control circuit 56 includes a multiplexer 102, which may be controlled by a signal 104, to output the control signal 58 consisting of one of the selected first voltage adjustment signal 92S and the selected second voltage adjustment signal 98S. Notably, the signal 104 may be generated internally or externally without affecting operation of the multiplexer 102.

The multiplexer 102 may be configured to output the control signal 58 exclusively including the selected first voltage adjustment signal 92S when the distributed RF signal 30 corresponds to the lower modulation bandwidth. In contrast, the multiplexer 102 may be configured to output the control signal 58 exclusively including the selected second voltage adjustment signal 98S when the distributed RF signal 30 corresponds to the higher modulation bandwidth.

Figure 4:
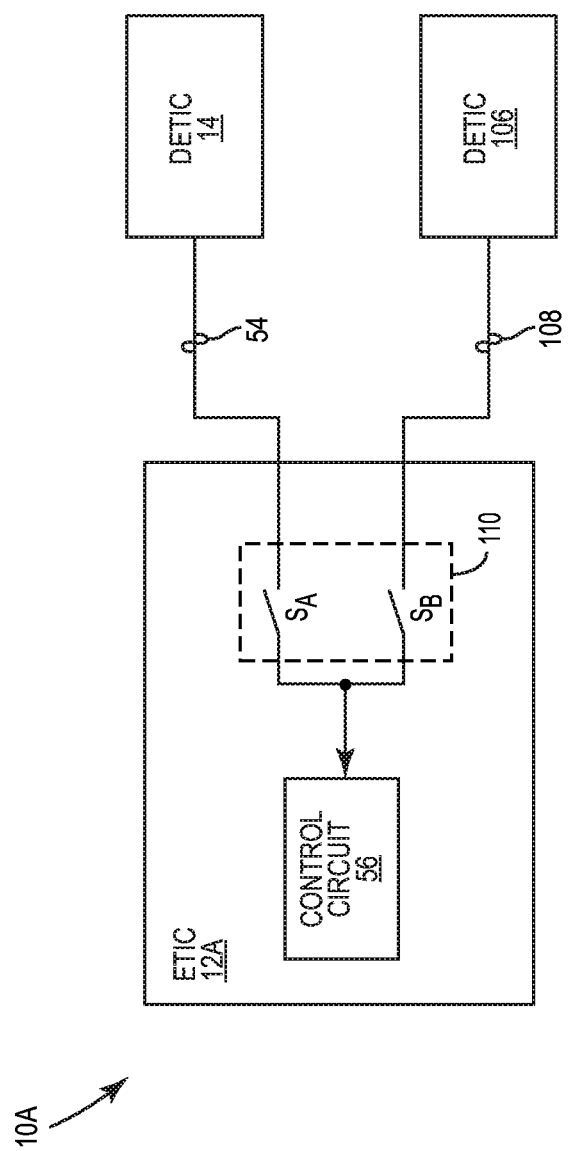
FIG. 4 is a schematic diagram of an exemplary ET amplifier apparatus configured according to another embodiment of the present disclosure to include more than one distributed ET integrated circuit (DETIC)

FIG. 4 is a schematic diagram of an exemplary ET amplifier apparatus 10A configured according to another embodiment of the present disclosure to include at least one second DETIC 106. Common elements between FIGS. 1 and 4 are shown therein with common element numbers and will not be re-described herein.

The second DETIC 106 may be configured to be identical to or different from the DETIC 14 in FIG. 1. The DETIC 14 and the second DETIC 106 are both coupled to an ETIC 12A. The second DETIC 106 is configured to provide at least one second feedback signal 108 to the ETIC 12A. The ETIC 12A may include a selection circuit 110 configured to selectively provide one of the feedback signal 54 and the second feedback signal 108 to the control circuit 56. The selection circuit 110 may include switches $S_A$ and $S_B$ for outputting the feedback signal 54 and the second feedback signal 108, respectively.

Alternative to coupling the DETIC 14 and the second DETIC 106 to the ETIC 12A via the selection circuit 110, it may also be possible to couple the DETIC 14 and the second DETIC 106 directly to the ETIC 12A by removing the selection circuit 110. In this regard, when the DETIC 14 is configured to provide the feedback signal 54 to the ETIC 12A, the second DETIC 106 may be configured to present a high impedance (e.g., tri-stated) to the ETIC 12A. In contrast, when the second DETIC 14 is configured to provide the second feedback signal 108 to the ETIC 12A, the DETIC 14 may be configured to present the high impedance (e.g., tri-stated) to the ETIC 12A.

Figure 5:
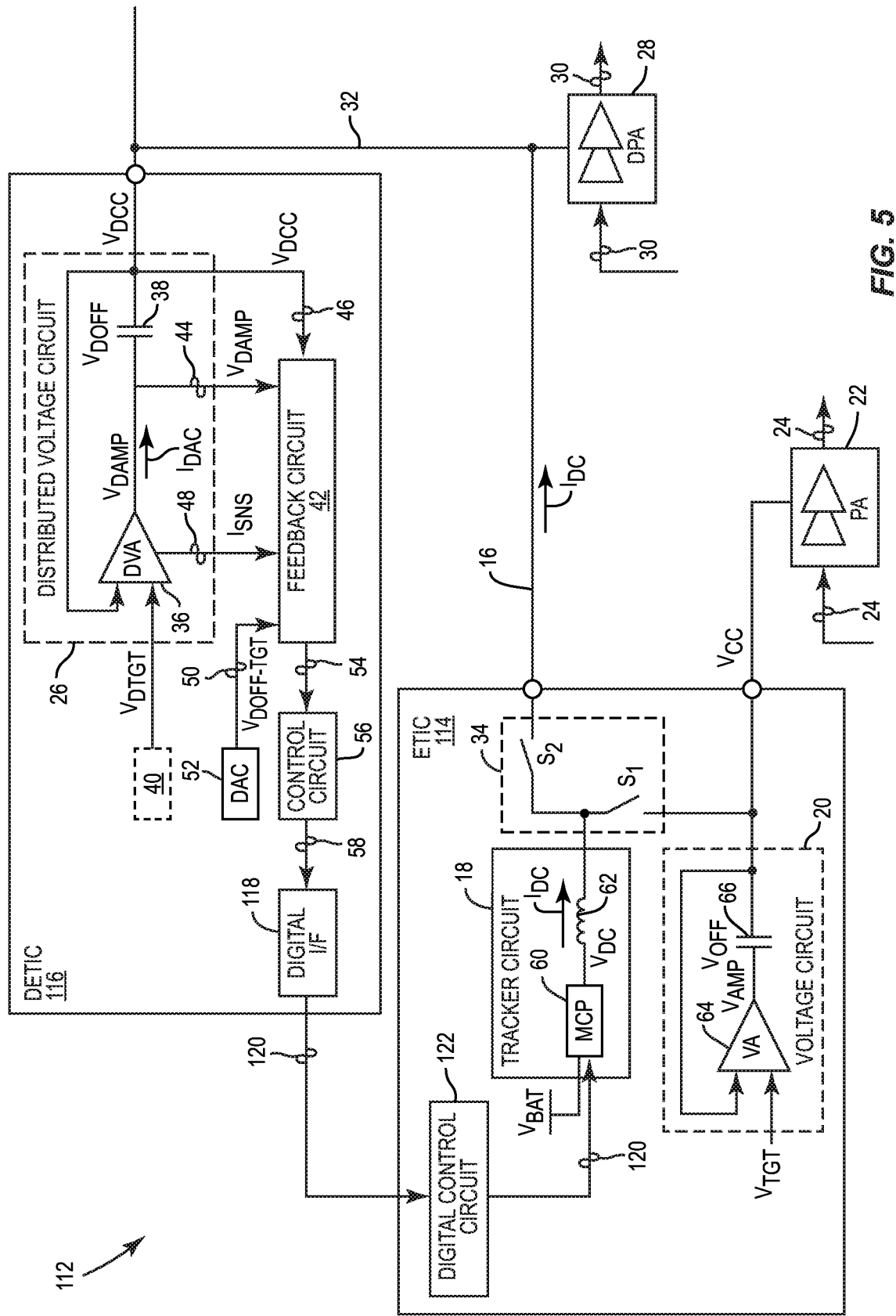
FIG. 5 is a schematic diagram of an exemplary ET amplifier apparatus configured according to another embodiment of the present disclosure.

FIG. 5 is a schematic diagram of an exemplary ET amplifier apparatus 112 configured according to another embodiment of the present disclosure. Common elements between FIGS. 1 and 5 are shown therein with common element numbers and will not be re-described herein.

The ET amplifier apparatus 112 includes an ETIC 114 and a DETIC 116 coupled to the ETIC 114. The DETIC 116 includes the control circuit 56, which was located in the ETIC 12 in the ET amplifier apparatus 10 of FIG. 1. The DETIC 116 also includes a digital interface circuit 118 configured to convert the control signal 58 into a digital control signal 120. The ETIC 114 includes a digital control circuit 122, which can be implemented by an FPGA as an example. The digital control circuit 122 receives the digital control signal 120 from the DETIC 116. Accordingly, the digital control circuit 122 may cause the tracker circuit 18 to adjust the low-frequency current $I_{DC}$ based on the digital control signal 120.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) amplifier apparatus comprising:
   an ET integrated circuit (IC) (ETIC) comprising:
      a tracker circuit configured to generate a low-frequency current; and
      a control circuit configured to:
         receive a feedback signal configured to indicate a desired level of the low-frequency current; and
         generate a control signal based on the feedback signal to cause the tracker circuit to adjust the low-frequency current to the desired level; and
   a distributed ETIC (DETIC) coupled to the ETIC and comprising:
      a distributed voltage circuit configured to generate a distributed voltage comprising a distributed offset voltage corresponding to the low-frequency current; and
   a feedback circuit configured to:
      receive at least one indication related to the distributed voltage;
      determine the desired level of the low-frequency current based on the at least one indication;
      generate the feedback signal to indicate the desired level of the low-frequency current; and
      provide the feedback signal to the control circuit.

2. The ET amplifier apparatus of claim 1 wherein the DETIC is coupled to a distributed amplifier circuit configured to amplify a distributed radio frequency (RF) signal based on the distributed voltage.

3. The ET amplifier apparatus of claim 2 further comprising the distributed amplifier circuit.

4. The ET amplifier apparatus of claim 2 wherein the distributed voltage circuit comprises:
   a distributed voltage amplifier configured to generate a distributed initial voltage based on a target voltage; and
   a distributed offset capacitor configured to raise the distributed initial voltage by the distributed offset voltage to generate the distributed voltage.

5. The ET amplifier apparatus of claim 4 wherein the at least one indication comprises:
   a first indication indicative of the distributed initial voltage;
   a second indication indicative of the distributed voltage;
   a third indication indicative of a sense current proportionally related to a high-frequency current being sourced or sunk by the distributed voltage amplifier; and
   a fourth indication indicative of a target for the distributed offset voltage.

6. The ET amplifier apparatus of claim 5 wherein the feedback circuit comprises:
   a current-to-voltage (I2V) converter configured to receive the third indication and convert the sense current into a sense voltage;
   a distributed controller configured to:
      receive the first indication, the second indication, and the fourth indication; and
      generate an offset control voltage based on the distributed initial voltage, the distributed voltage, and the target for the distributed offset voltage;
   a first voltage combiner configured to combine the sense voltage and the offset control voltage to generate a first voltage feedback;
   a second voltage combiner configured to generate a differential voltage between the distributed voltage and the distributed initial voltage;
   an input multiplexer configured to selectively output one of the differential voltage and the distributed voltage;
   a filter circuit configured to generate a second voltage feedback based on the target for the distributed offset voltage and the output of the input multiplexer; and
   an output multiplexer configured to generate the feedback signal consisting of one of the first voltage feedback and the second voltage feedback.

7. The ET amplifier apparatus of claim 6 wherein the feedback circuit is further configured to generate the feedback signal consisting of the first voltage feedback when the distributed RF signal corresponds to a lower modulation bandwidth.

8. The ET amplifier apparatus of claim 7 wherein:
   the distributed voltage amplifier is further configured to generate a distributed initial ET voltage based on a distributed ET target voltage; and
   the distributed offset capacitor is further configured to raise the distributed initial ET voltage by the distributed offset voltage to generate a distributed ET voltage.

9. The ET amplifier apparatus of claim 6 wherein the feedback circuit is further configured to generate the feedback signal consisting of the second voltage feedback when the distributed RF signal corresponds to a higher modulation bandwidth.

10. The ET amplifier apparatus of claim 9 wherein:
the distributed voltage amplifier is further configured to generate a distributed initial ET voltage based on a distributed ET target voltage; and
the distributed offset capacitor is further configured to raise the distributed initial ET voltage by the distributed offset voltage to generate the distributed voltage as a distributed ET voltage.

11. The ET amplifier apparatus of claim 10 wherein the input multiplexer is further configured to output the differential voltage when the distributed voltage circuit is configured to generate the distributed voltage as the distributed ET voltage.

12. The ET amplifier apparatus of claim 9 wherein:
the distributed voltage amplifier is further configured to generate a distributed initial average power tracking (APT) voltage based on a distributed APT target voltage; and
the distributed offset capacitor is further configured to raise the distributed initial APT voltage by the distributed offset voltage to generate the distributed voltage as a distributed APT voltage.

13. The ET amplifier apparatus of claim 12 wherein the input multiplexer is further configured to output the distributed voltage when the distributed voltage circuit is configured to generate the distributed voltage as the distributed APT voltage.

14. The ET amplifier apparatus of claim 2 wherein the tracker circuit comprises:
a multi-level charge pump (MCP) configured to generate a low-frequency voltage at multiple voltage levels proportionally related to a battery voltage; and
a power inductor configured to induce the low-frequency current based on the low-frequency voltage.

15. The ET amplifier apparatus of claim 14 wherein the control circuit comprises:
a plurality of first comparators configured to compare the feedback signal against a plurality of first thresholds to generate a plurality of first voltage adjustment signals, respectively;
a state machine logic configured to selectively output a selected first voltage adjustment signal among the plurality of first voltage adjustment signals;
a plurality of second comparators configured to compare the feedback signal against a plurality of second thresholds to generate a plurality of second voltage adjustment signals, respectively;
an arbitration logic configured to selectively output a selected second voltage adjustment signal among the plurality of second voltage adjustment signals; and
a multiplexer configured to output the control signal consisting of one of the selected first voltage adjustment signal and the selected second voltage adjustment signal.

16. The ET amplifier apparatus of claim 15 wherein the multiplexer is further configured to:
output the control signal consisting of the selected first voltage adjustment signal when the distributed RF signal corresponds to a lower modulation bandwidth; and
output the control signal consisting of the selected second voltage adjustment signal when the distributed RF signal corresponds to a higher modulation bandwidth.

17. The ET amplifier apparatus of claim 14 wherein the MCP is further configured to adjust the low-frequency voltage among the multiple voltage levels based on the control signal to cause the power inductor to adjust the low-frequency current.

18. The ET amplifier apparatus of claim 1 further comprising at least one second DETIC coupled to the ETIC and configured to provide at least one second feedback signal to the ETIC.

19. The ET amplifier apparatus of claim 18 wherein the ETIC further comprises a selection circuit configured to selectively provide one of the feedback signal and the at least one second feedback signal to the control circuit.

20. An envelope tracking (ET) amplifier apparatus comprising:
an ET integrated circuit (IC) (ETIC) comprising:
a tracker circuit configured to generate a low-frequency current; and
a digital control circuit configured to:
receive a digital control signal configured to indicate a desired level of the low-frequency current; and
cause the tracker circuit to adjust the low-frequency current to the desired level; and
a distributed ETIC (DETIC) coupled to the ETIC and comprising:
a distributed voltage circuit configured to generate a distributed voltage comprising a distributed offset voltage corresponding to the low-frequency current; and
a feedback circuit configured to:
receive at least one indication related to the distributed voltage;
determine the desired level of the low-frequency current based on the at least one indication; and
generate a feedback signal to indicate the desired level of the low-frequency current;
a control circuit configured to:
receive the feedback signal from the feedback circuit; and
generate a control signal based on the feedback signal; and
a digital interface circuit configured to:
convert the control signal into the digital control signal; and
provide the digital control signal to the digital control circuit.

\* \* \* \* \*